US007062396B2

(12) United States Patent
Ogawa (10) Patent No.: US 7,062,396 B2
(45) Date of Patent: Jun. 13, 2006

(54) APPARATUS FOR OPTICAL PROXIMITY CORRECTION, METHOD FOR OPTICAL PROXIMITY CORRECTION, AND COMPUTER PROGRAM PRODUCT FOR OPTICAL PROXIMITY CORRECTION (75) Inventor: Ryuji Ogawa, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 71 days.

(21) Appl. No.: 10/807,317

(22) Filed: Mar. 24, 2004

(65) Prior Publication Data

US 2004/0263866 A1  Dec. 30, 2004

(30) Foreign Application Priority Data

Mar. 25, 2003  (JP)  ............................ P2003-083678

(51) Int. Cl.
*G01D 18/00* (2006.01)
(52) U.S. Cl. ........................................ 702/85; 438/401
(58) Field of Classification Search ................. 702/85, 702/94, 95, 150; 438/401; 382/145; 716/2, 716/19, 21; 250/559.26; 430/30, 5; 62/60
See application file for complete search history.

(56) References Cited

U.S. PATENT DOCUMENTS 6,426,269 B1 * 7/2002 Haffner et al. ............... 438/401
6,536,015 B1    3/2003 Ono ............................. 716/2
6,570,174 B1    5/2003 Tounai et al. ........... 250/559.26
6,868,175 B1 * 3/2005 Yamamoto et al. ......... 382/145

* cited by examiner

*Primary Examiner*—Michael Nghiem
*Assistant Examiner*—Xiuqin Sun
(74) *Attorney, Agent, or Firm*—Finnegan, Henderson, Farabow, Garrett & Dunner, L.L.P.

(57) ABSTRACT

An apparatus for optical proximity correction according to an embodiment of the present invention has a data collector configured to collect source data of a circuit pattern, an edge line detector configured to detect edge lines each of which has a size that is less than a line width of the electrical circuit pattern, an edge line modifier configured to modify each of the edge lines so as to prevent an excess optical proximity correction, and a data synthesizer configured to generate pre-correction data from the modified edge lines and the source data.

18 Claims, 11 Drawing Sheets

APPARATUS FOR OPTICAL PROXIMITY CORRECTION, METHOD FOR OPTICAL PROXIMITY CORRECTION, AND COMPUTER PROGRAM PRODUCT FOR OPTICAL PROXIMITY CORRECTION

CROSS REFERENCE TO RELATED APPLICATIONS

This application is based upon and claims the benefit of priority from prior Japanese Patent Application P2003-083678 filed on Mar. 25, 2003; the entire contents of which are incorporated by reference herein.

BACKGROUND OF THE INVENTION

1. Field of the Invention

The present invention relates to a layout design of a semiconductor integrated circuit and in particular to an apparatus for optical proximity correction and a method for optical proximity correction.

2. Description of the Related Art

As semiconductor devices continue to shrink in size over time, so do the individual circuit patterns. Therefore, reproducing a designed circuit pattern on a wafer by exposing a mask has recently became difficult. In particular, corner rounding and line end foreshortening are typically observed. Such phenomena are called optical proximity effects (OPE). To avoid the OPE, an optical proximity correction (OPC) has recently spread. However, as circuit patterns continue to shrink in size, a shape formed by edge lines each of which has a size that is less than a line width of the electrical circuit pattern has appeared. Such shape cannot be corrected by the OPC.

Generally, edge lines of the circuit pattern are divided to multiple portions by identifying the vertex of the pattern prior to the OPC. However, if the divided edge lines are too small, the OPC may provide an incorrect data. Such edge lines have very little affect on the projected image. However, when the OPC is applied to the pattern data containing such edge lines, excess correction is occasionally applied to the portion around the edge lines. Consequently, data applied by the OPC provides an incorrect projection image on the wafer.

Further, an OPC module adopting the OPC method identifies the corner and the line end of the circuit pattern on the assumption that the shape of the corner or the line end is simple Therefore, in the case where a hollow or protuberances, which has a size that is less than a line width, located on the line end and the corner, it is impossible for the OPC module to identify the corner and the line end. Therefore, the OPC module applies an incorrect OPC to the circuit pattern, which decreases precision of the mask.

Such shapes may be generated during the mask data processing (MDP). Some of the shapes in the pattern is meaningless for the circuit and increases the turn around time for the OPC.

SUMMARY OF THE INVENTION

An aspect of present invention inheres in an apparatus for optical proximity correction according to an embodiment of the present invention having a data collector configured to collect source data of an electrical circuit pattern, an edge line detector configured to detect a plurality of edge lines each of which has a size that is less than a line width of the electrical circuit pattern, an edge line modifier configured to modify each of the edge lines so as to prevent an excess optical proximity correction, and a data synthesizer configured to generate pre-correction data from the modified edge lines and the source data.

Another aspect of the present invention inheres in a computer implemented method for optical proximity correction according to the embodiment of the present invention having collecting source data of an electrical circuit pattern, detecting a plurality of edge lines each of which has a size that is less than a line width of the electrical circuit pattern, modifying each of the edge lines so as to prevent an excess optical proximity correction, and generating pre-correction data from the modified edge lines and the source data.

Yet another aspect of the present invention inheres in a computer program product for controlling a computer system so as to correct an optical proximity effect according to the embodiment of the present invention, the computer program product having instructions configured to collect a source data of an electrical circuit pattern stored in the computer system, instructions configured to detect a plurality of edge lines each of which has a size that is less than a line width of the electrical circuit pattern, instructions configured to modify each of the edge lines so as to prevent an excess optical proximity correction, and instructions configured to generate pre-correction data from the modified edge lines and the source data.

DETAILED DESCRIPTION OF THE INVENTION

Various embodiments of he present invention will be described with reference to the accompanying drawings. It is to be noted that the same or similar reference numerals are applied to the same or similar parts and elements throughout the drawings, and the description of the same or similar parts and elements will be omitted or simplified.

FIRST EMBODIMENT

Figure 1:
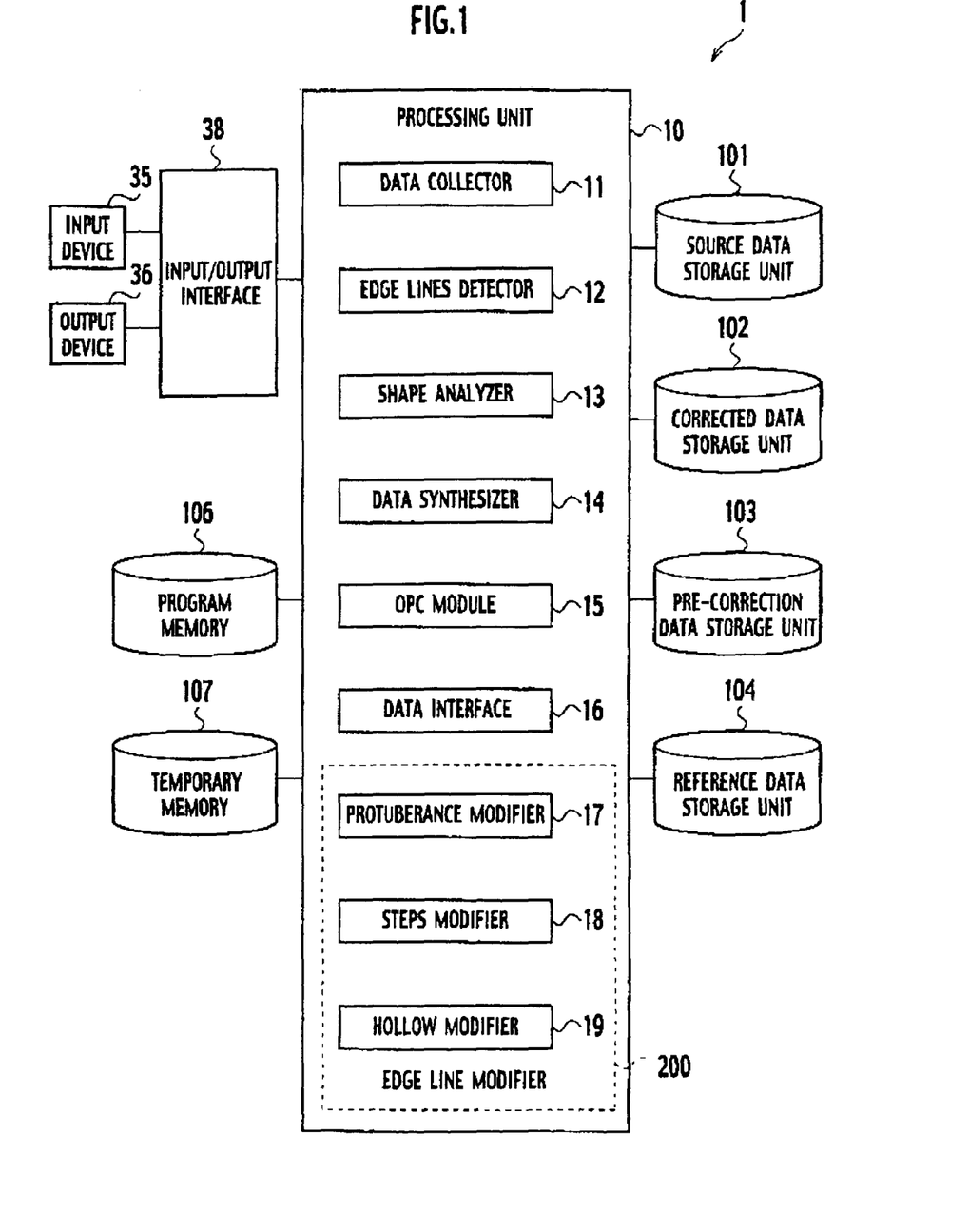
FIG. 1 is a block diagram of an apparatus for optical proximity correction in accordance with the first embodiment of the present invention.

With reference now to FIG. 1, an apparatus for optical proximity correction 1 according to a first embodiment of the present invention has a processing unit 10, an input/output interface 38 connected to the processing unit 10, a source data storage unit 101, a corrected data storage unit 102, a pre-correction data storage unit 103, a reference data storage unit 104, a program memory 106, and a temporary memory 107. An input device 35 and an output device 36 are connected to the input/output interface 38. An external hard disc drive may be used in conjunction with each of the source data storage unit 101, the corrected data storage unit 102, the pre-correction data storage unit 103, and the reference data storage unit 104. Incorporating the source data storage unit 101, the corrected data storage unit 102, the pre-correction data storage unit 103, and the reference data storage unit 104 into the processing unit 10 by using an internal hard disc drives is an alternative. Further, the source data storage unit 101, the corrected data storage unit 102, the pre-correction data storage unit 103, and the reference data storage unit 104 may be connected to the processing unit 10 through a computer network. In this case, the source data storage unit 101, the corrected data storage unit 102, the pre-correction data storage unit 103, and the reference data storage unit 104 may form a data base server.

The source data storage unit 101 stores source data of a circuit pattern such as circuit layout data. The corrected data storage unit 102 saves corrected data that are applied by optical proximity correction (OPC). The pre-correction data storage unit 103 saves pre-correction data prepared for the OPC. The reference data storage unit 104 saves pattern data that are locate near OPC target data of the pre-correction data that are referenced when the OPC is applied to the OPC target data.

The processing unit 10 has a data collector 11, an edge line detector 12, a shape analyzer 13, a data synthesizer 14, an OPC module 15, a data interface 16, and an edge line modifier 200. Further, the edge line modifier 200 has a protuberance modifier 17, a steps modifier 18, and a hollow modifier 19. The processing unit 10 manages data transfer with the source data storage unit 101, the corrected data storage unit 102, the pre-correction data storage unit 103, and the reference data storage unit 104 and modifies the data so as to prevent an excess OPC.

Figure 4A:
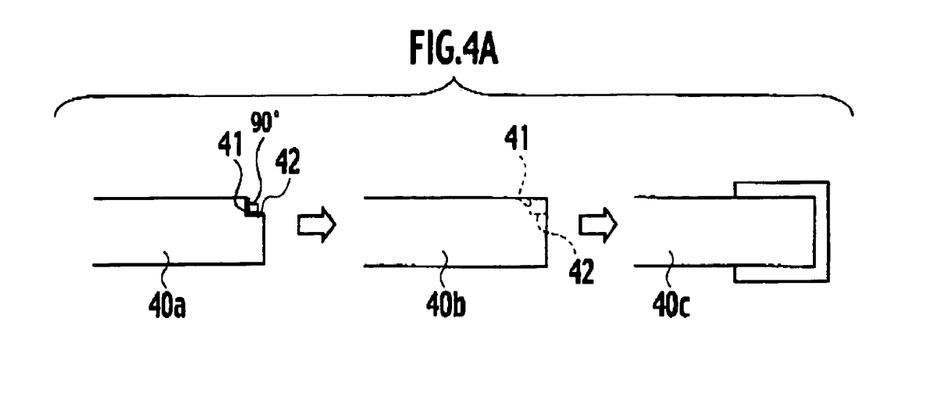
FIG. 4A, FIG. 4B, and FIG. 4C are example illustrations of circuit patterns in accordance with the first embodiment of the present invention.
Figure 4B:
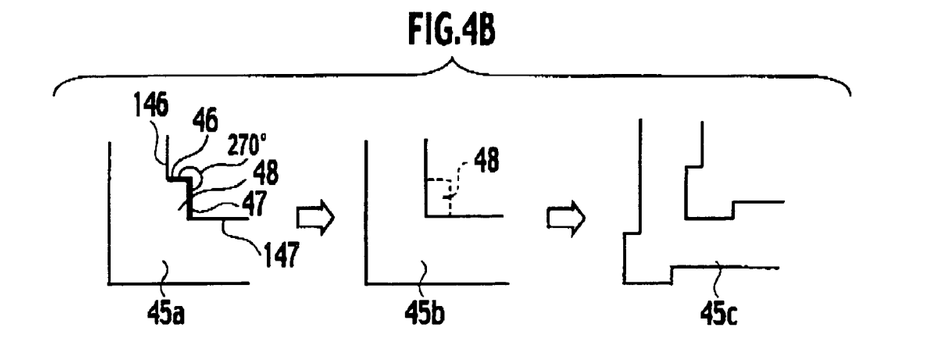
Figure 4C:
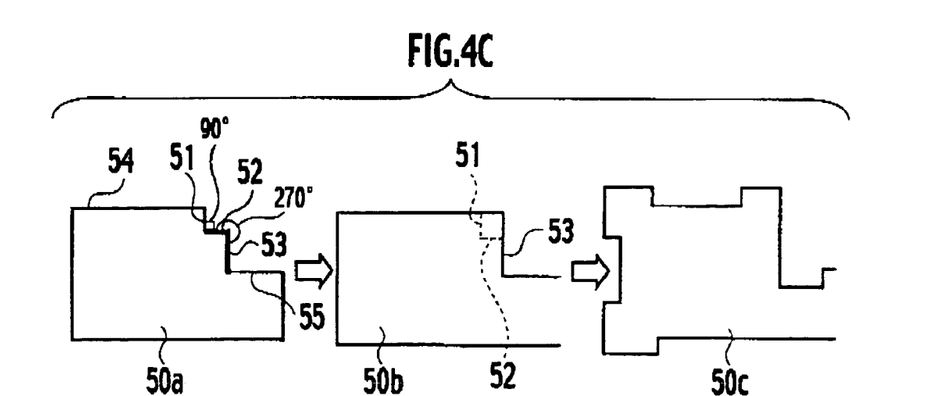

The data collector 11 collects the source data from the source data storage unit 101 The edge line detector 12 detects minute edge lines that cannot be detected in mask inspection from the source data. The term "minute edge line" refers to an edge line in which length is less than a line width of the circuit pattern. Specifically, the length of the minute edge line is shorter than 0.1 µm. With reference to FIG. 4A, a pattern 40a contains the minute edge lines 41, 42, each length of which cannot be detected in the mask inspection. The edge line detector 12 shown in FIG. 1 detects the minute edge lines 41, 42 from the pattern 40a. In FIG. 4B, the pattern 45a contains the minute edge lines 46, 47. The edge line detector 12 detects the minute edge lines 46, 47 from the pattern 45a. In FIG. 4C, the pattern 50a containing the minute edge lines 51, 52, 53 is shown. The edge line detector 12 detects the minute edge lines 51, 52, 53 from the pattern 50a.

The shape analyzer 13 classifies a shape formed by the adjacent minute edge lines into "hollow", "protuberance", and "steps" and classifies each minute edge line's position into "line end", "corner", and "connecting position". For example, in FIG. 4A, since the minute edge lines 41, 42 are detected from the pattern 40a, the number of detected minute edge lines is "2". The minute edge line 41 connects with the minute edge line 42 at an angle of 90 degrees. In this case, shape analyzer 13 classifies the shape formed by the adjacent minute edge lines 41, 42 as "hollow" and classifies the position of the minute edge lines 41, 42 as "line end". In FIG. 4B, the minute edge lines 46, 47 are detected from the pattern 45a and the number of detected minute edge lines is "2". The minute edge line 46 connects with the minute edge line 47 at an angle of 270 degrees. In this case, shape analyzer 13 classifies the shape formed by the adjacent minute edge lines 46, 47 as "protuberance" and classifies the position of the minute edge lines 46, 47 as "corner". In FIG. 4C, the minute edge lines 51, 52, and 53 are detected from the pattern 50a and the number of detected minute edge lines is "3". The minute edge line 51 connects with the minute edge line 52 at an angle of 90 degrees. The minute edge line 52 connects with the minute edge line 53 at an angle of 270 degrees. In this case, shape analyzer 13 classifies the shape formed by the adjacent minute edge lines 51, 52, 53 as "steps" and classifies the position of the minute edge lines 51, 52, and 53 as "connecting position". It should be, noted that a value of the "angle" made by the two minute edge lines is measured from the outside of the pattern.

In the case where more than 3 minute edge lines are detected and the number of the detected minute edge lines is an even number, the position of the detected minute edge lines Is classified as "line end" or the "corner". For example, when four minute edge lines are detected and the detected four minute edge lines make a 270 degrees angle, a 90 degrees angle and a 270 degrees angle, the position of the detected edge lines is classified as a "corner". However, the four minute edge lines make a 90 degrees angle, a 270 degrees angle and a 90 degrees angle, the position of the detected edge lines is classified as a "line end".

When six minute edge lines are detected and the detected six minute edge lines make a 270 degrees angle, a 90 degrees angle, a 270 degrees angle, a 90 degrees angle, and a 270 degrees angle, the position of the detected six edge lines is classified as a "corner". In the case where the detected six minute edge lines make a 90 degrees angle, a 270 degrees angle, a 90 degrees angle, a 270 degrees angle, and a 90 degrees angle, the position of the detected six edge lines is classified as a "line end".

In the case where the number of the detected minute edge lines is an odd number, the position of the detected minute edge lines is classified as a "connecting position". In the "corner position" shown in FIG. 4B, the number of the minute edge lines 46, 47 is an even and the minute edge lines 46, 47 are connected to edge lines 146, 147 that are perpendicular to each other. On the other hand, in the "connecting position" shown in FIG. 4C, the number of the minute edge lines 51, 52, 53 is an odd and the minute edge lines 51, 53 are connected to the edge lines 54, 55 that are parallel to each other.

With reference again to FIG. 1, the hollow modifier 19 flattens the hollow formed by the adjacent minute edge lines.

Specifically, when the shape analyzer 13 classifies the shape formed by the minute edge lines 41, 42 shown in FIG. 4A as "hollow", the hollow modifier 19 flattens the hollow of pattern 40a and generates the modified pattern 40b.

The protuberance modifier 17 shown in FIG. 1 flattens a protuberance formed by the adjacent minute edge lines. Specifically, when the shape analyzer 13 classifies the shape formed by the minute edge lines 46, 47 shown in FIG. 4B as "protuberance 48", the protuberance modifier 17 deletes the protuberance 48 and generates the modified pattern 45b.

The steps modifier 18 shown in FIG. 1 flattens steps formed by the adjacent minute edge lines. The steps modifier 18 flattens the steps by filling up the hollow in the steps or deleting the protuberance in the steps. Specifically, when the shape analyzer 13 classifies the shape formed by the three adjacent minute edge lines 51, 52, 53 shown in FIG. 4C as "steps", the steps modifier 18 fills up the hollow formed by the minute edge lines 51, 52 and generates the modified pattern 50b.

The data synthesizer 14 shown in FIG. 1 generates pre-correction data from the modified pattern and the source data. The OPC module 15 applies the OPC to the pre-correction data and generates corrected data. The data interface 16 saves the pre-correction data, the corrected data, and the reference data in the pre-correction data storage unit 103, the corrected data storage unit 102, and the reference data storage unit 104.

A keyboard, a mouse, an optical character reader, an image scanner and a voice device are available for use as the input device 35. A display monitor such as a liquid crystal display or a cathode ray tube display, and a printer are available for use as the output device 36. The input/output interface 38 connects the input device 35 and the output device 36 with the processor unit 10. A CD-ROM drive and a flexible disc drive may also be connected to the input/output device 38.

A read only memory (ROM) and a random access memory (RAM) and the hard disc drive may be used for the program memory 106 and the temporary data memory 107. The program memory 106 stores programs such as an operating system for managing the data transfer and calculation in the processing unit 10. The temporary data memory 107 saves temporary data generated in the processing unit 10.

Figure 2:
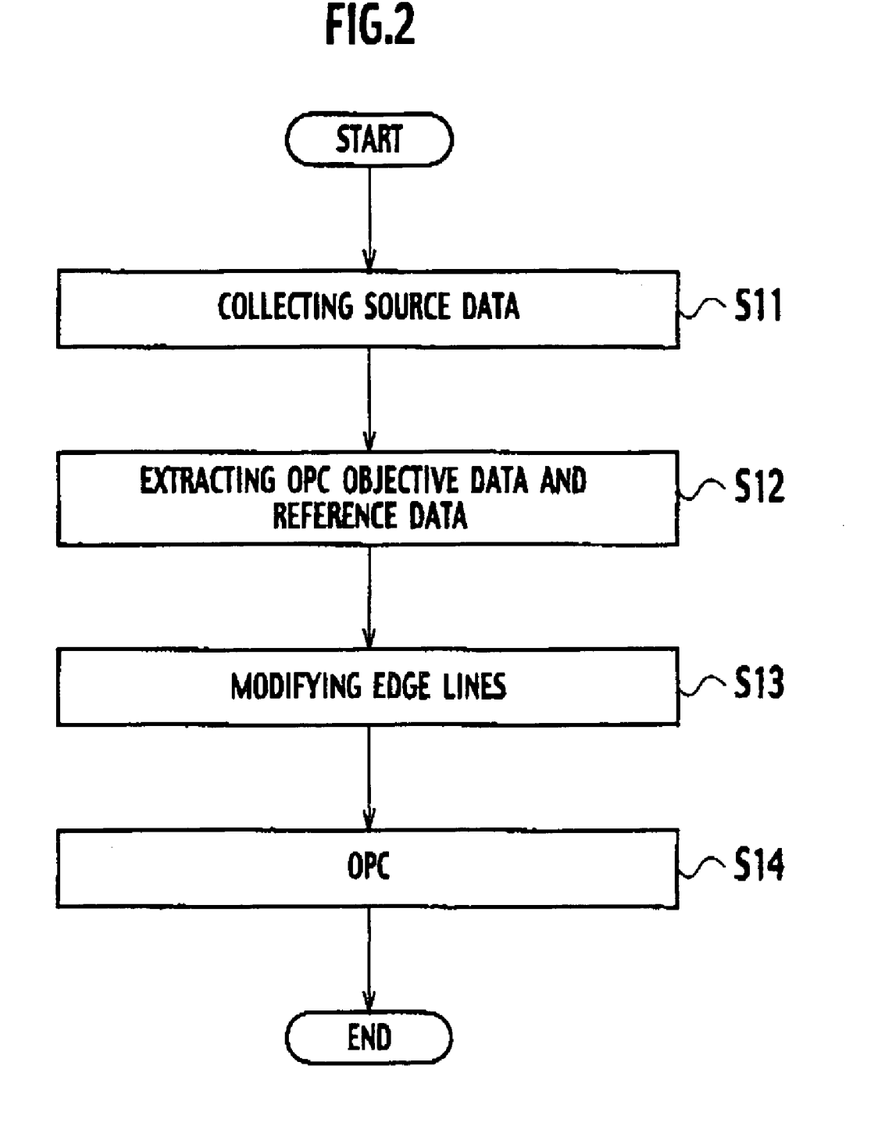
FIG. 2 is a flowchart depicting a method for optical proximity correction in accordance with the first embodiment of the present invention.

With reference next to FIG. 2, an outline of a computer implemented method for OPC in accordance with the first embodiment is described.

(A) In step S11, the data collector 11 shown in FIG. 1 collects the source data from the source data storage unit 101. In step S12, the data collector 11 extracts OPC objectives such as the patterns 40a, 45a, 50a shown in FIGS. 4A, 4B, 4C from the source data and also extracts the reference data for the OPC. The data interface 16 shown in FIG. 1 stores the reference data in the reference data storage unit 104.

(B) In step S13, the edge line modifier 200 modifies each of the minute edge lines contained in the OPC objectives so as to prevent an excess OPC. Specifically, the edge line modifier 200 flattens the hollow formed by the adjacent minute edge lines 41, 42 shown in FIG. 4A, the protuberance 48 formed by the adjacent minute edge lines 46, 47 shown in FIG. 4B, and the steps formed by the adjacent minute edge lines 51, 52, 53 shown in FIG. 4C. Thereafter, the data synthesizer generates the pre-correction data from the modified patterns 40b, 45b, 50b shown in FIGS. 4A, 4B, 4C and the source data. The data interface 16 saves the pre-correction data in the pre-correction data storage unit 103.

(C) In step S14, the OPC module 15 applies the OPC to the pre-correction data and generates the corrected data. Thereafter, the data interface 16 saves the corrected data in the corrected data storage unit 102.

Figure 3:
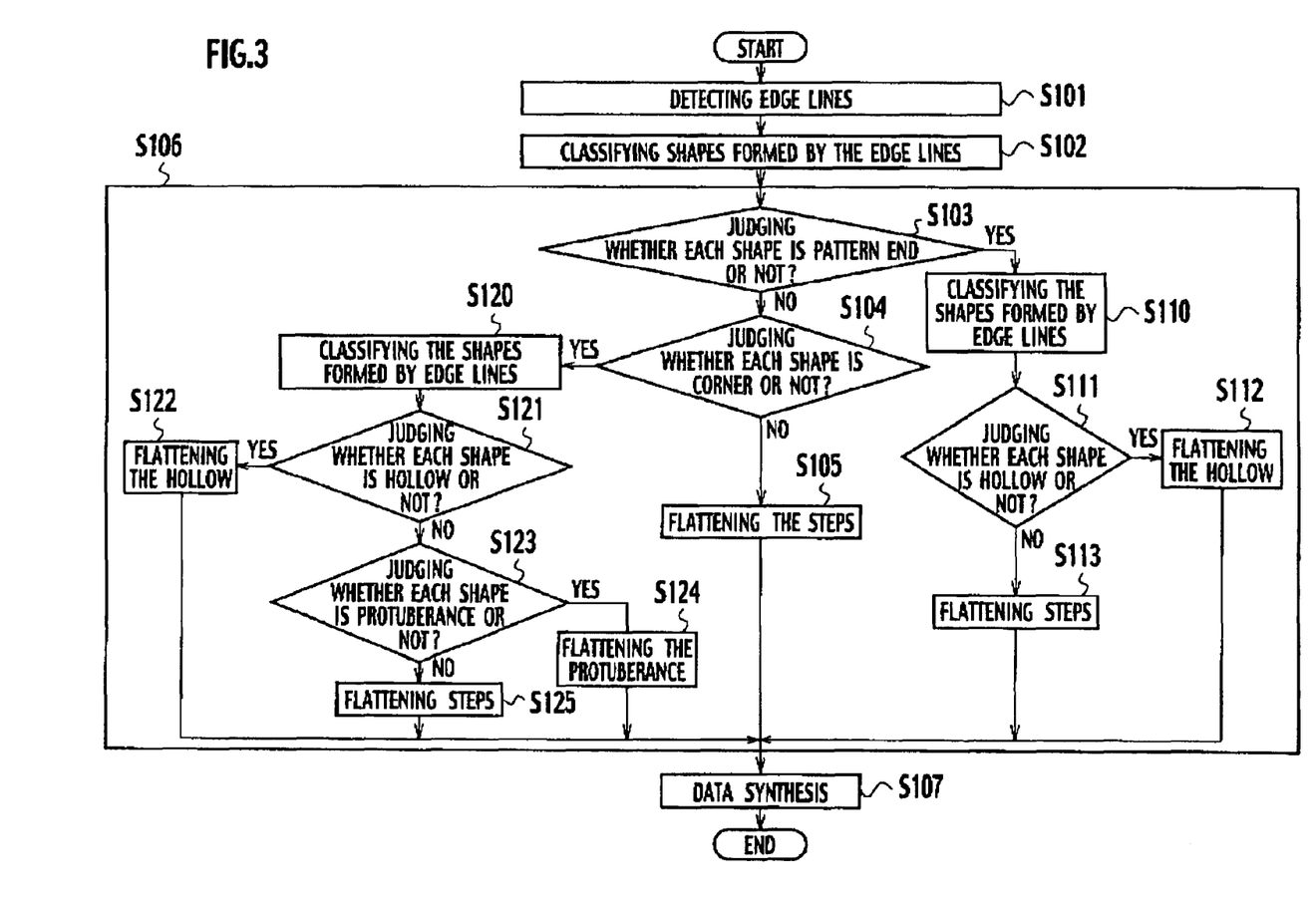
FIG. 3 is a flowchart depicting a detailed method for optical proximity correction in accordance with the first embodiment of the present invention.

With reference next to FIG. 3, a detailed computer implemented method for OPC in accordance with the first embodiment is described. The procedure shown in FIG. 3 corresponds to the step S13 shown in FIG. 2.

(a) In step S101, the edge line detector 12 shown in FIG. 1 detects the minute edge lines each of which length is shorter than 0.1 μm from the OPC objective patterns Specifically, the edge line detector 12 detects the minute edge lines 41, 42, 46, 47, 51, 52, and 53 shown in FIGS. 4A, 4B, and 4C.

(b) In step S102, the shape analyzer 13 analyzes the angle made by the adjacent minute edge lines and the number of the sequence minute edge lines. Further, the shape analyzer 13 classifies the shape formed by the adjacent minute edge lines as a "hollow", "protuberance", and "steps". The shape analyzer 13 also classifies he position of the minute edge lines as "line end", "corner", and "connecting position". Specifically, the shape formed by the minute edge lines 41, 42 shown in FIG. 4A is classified as "hollow" and determined as "line end". The shape formed by the minute edge lines 46, 47, 48 shown in FIG. 4B is classified as "protuberance" and determined as "corner". The shape formed by the minute edge lines 51, 52, 53 shown in FIG. 4C is classified as "steps" and determined as "connecting position"

(c) In step S106, the minute edge lines are modified depending on the shape that the adjacent minute edge lines form and the position. A detailed procedure in step S106 is set forth bellow.

(i) In step S103, the shape analyzer 13 judges or determines whether each of the detected minute edge lines is located on the "line end" or not. When the minute edge lines are located on the "line end", the procedure goes to step S110. In step S110, the shape analyzer 13 classifies the shape formed by the adjacent minute edge lines. In step S111, the shape analyzer 13 judges or determines whether the classified shape is a hollow or not. When the shape is the hollow as shown in FIG. 4A, the hollow modifier 19 flattens the hollow formed by the minute edge lines 41, 42 and generates the modified pattern 40b in step S112. When the shape is not hollow, the steps modifier 18 flattens the steps formed by the minute edge lines in step S113.

(ii) When the shape analyzer 13 judges or determines the detected minute edge line is not located on the "line end", the next procedure is step S104. In step S104, the shape analyzer 13 judges or determines whether the minute edge line locates on the "corner" or not. When the minute edge line locates on the "corner", the program proceeds to step S120. In step S120, the shape analyzer 13 classifies the shape formed by the adjacent minute edge lines. Thereafter, the shape analyzer 13 judges or determines whether the shape is a "hollow" or not When the shape analyzer 13 judges the shape is the "hollow", the hollow modifier 19 flattens the hollow in step S122. When the shape analyzer 13 judges the shape is not the "hollow", the shape analyzer 13 judges or determines whether the shape is a "protuberance" or not in step S123. When the shape analyzer 13 judges the shape is a "protuberance" as shown in FIG. 4B, the protuberance modifier 17 flattens the protuberance formed by the minute edge lines 46, 47 and generates the modified pattern

45b in step S124. When the shape analyzer 13 judges the shape is not a "protuberance", the steps modifier 18 flattens the steps formed by the adjacent minute edge lines.

(iii) When the shape analyzer 13 judges or determines the shape formed by the minute edge lines is not the corner in step S104, the shape of the minute edge lines is "steps" as shown in FIG. 34C. In this case, the steps modifier 18 flattens the steps formed by the minute edge lines 51, 52, 53 and generates the modified pattern 50b in step S105.

(d) Step S107 is the next procedure of each of the steps S105, 112, 113, 122, 124, and 125. In step S107, the data synthesizer 14 synthesizes the source data and the modified patterns generated by the edge line modifier 200 shown in FIG. 1 to generate the pre-correction data for OPC. The data interface 16 saves the pre-correction data in the pre-correction data storage unit 103. Thereafter, with reference again to FIG. 2, the OPC module 15 applies the OPC to pre-correction data such as the patterns 40b, 45b, and 50b as shown in FIGS. 4A, 4B, and 4C and generates corrected data containing corrected pattern 40c, 45c, and 50c in step S14.

Thus, the apparatus and the method for the OPC shown in FIGS. 1, 2, and 3 in accordance with the first embodiment of the invention make it possible to eliminate the shapes formed by the minute edge lines that create the excess OPC. Such excess OPC causes wrong corrected data synthesis, which leads to the mask defect. In addition, wrong corrected pattern contained in the wrong corrected data may produce a wrong projection image on a wafer when the wrong corrected pattern is exposed. However, the apparatus and the method for the OPC, shown in FIGS. 1, 2, and 3, make it possible to provide an accurate OPC. Therefore, it is possible to generate a precise projection image on the wafer.

SECOND EMBODIMENT

Figure 5:
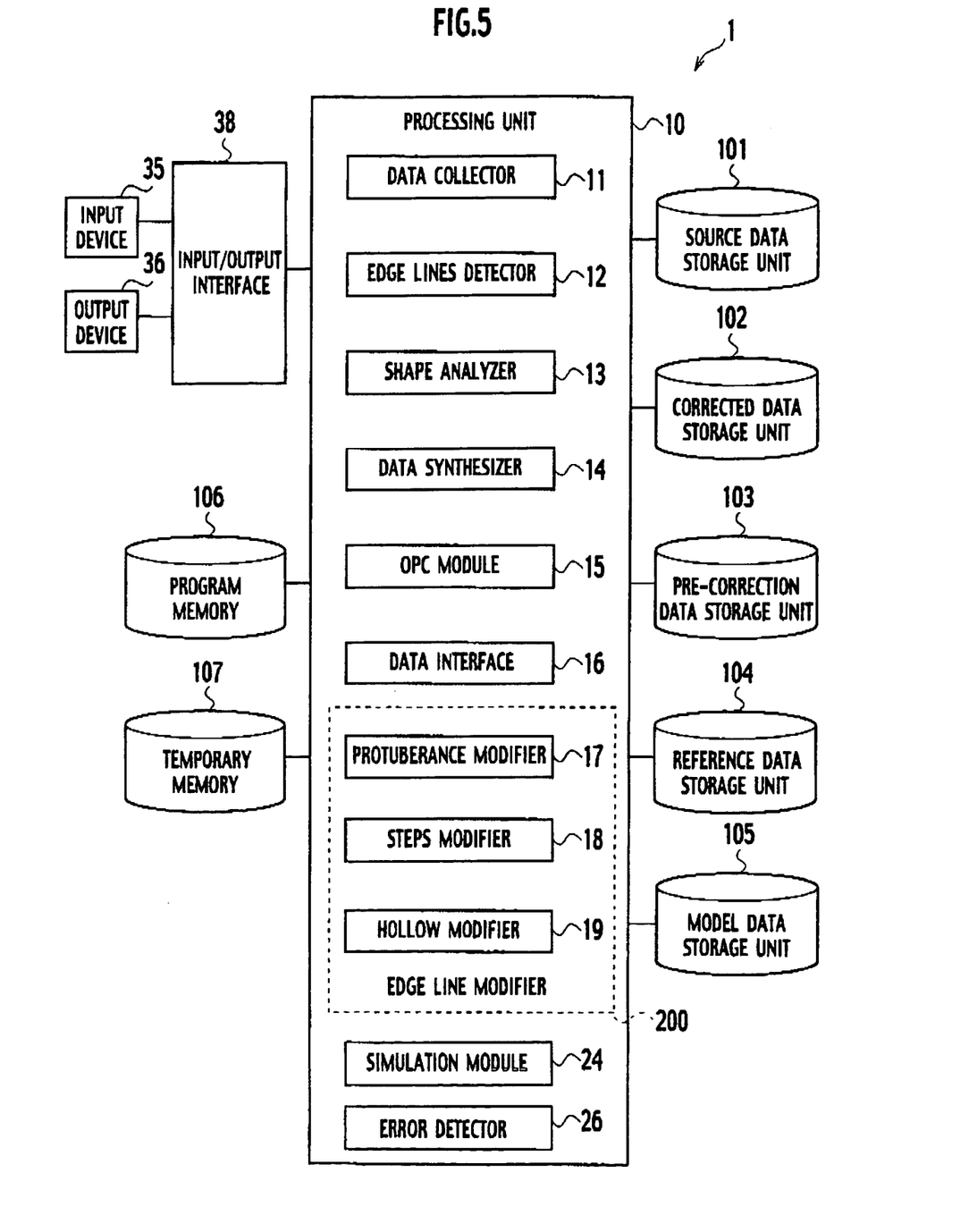
FIG. 5 is a block diagram of an apparatus for optical proximity correction in accordance with a second embodiment of the present invention.

With reference now to FIG. 5, the apparatus for OPC 1 according to a second embodiment of the present invention has a model data storage unit 105 connected to the processing unit 10. The model data storage unit 105 saves the source data as model data. The model data are set as target data of projection images reproduced from the corrected data while the OPC is applied to the pre-correction data.

Further, the processing unit 10 has a simulation module 24 and an error detector 26. The simulation module 24 calculates the projection image of the corrected data generated by the OPC module 15. The error detector 26 judges or determines whether the simulated projection image fulfills required conditions of the electrical circuit. Other components of the apparatus for OPC 1 shown in FIG. 5 are similar to the apparatus shown in FIG. 1. Therefore, detailed explanation for other components is eliminated.

Generally, an existing OPC simulator only receives inputs of the pre-correction data and the reference data. Therefore, a copy of the pre-correction data is set as the model data of the projection image on the wafer while the OPC is applied to the pre-correction data. Specifically, the protuberance modifier 17 deletes the protuberance 91 in the pattern 90a shown in FIG. 7A and generates the modified pattern 90b. When the copy of the modified pattern 90b is set as the model data and the OPC is applied to the pre-correction data containing the modified pattern 90b, the corrected data containing the corrected pattern 90c shown in FIG. 7B is generated. However, the corrected pattern 90c is generated so as to provide the projection image similar to the modified pattern 90b. Therefore, the projection pattern 93 shown in FIG. 7B is produced on the wafer when the corrected pattern 90c is exposed by a stepper. However, in the case where the protuberance 91 is used for the connection to the via, the projection pattern 93 may cause a violation of the size allowance and the design rules for the pattern and space width, since the protuberance 91 is neglected during the OPC. To avoid such violation, the apparatus and the method for OPC according to the second embodiment adopts the pattern 90a shown in FIG. 7A as the model data during the OPC. By setting the pattern 90a as the model data, the OPC module generates the corrected pattern 90d shown in FIG. 7C that produces the projection pattern 94. As shown in FIG. 7C, the projection pattern 94 covers the area corresponding to the protuberance 91. Therefore, the projection pattern 94 avoids such violation of the design rules.

Figure 6:
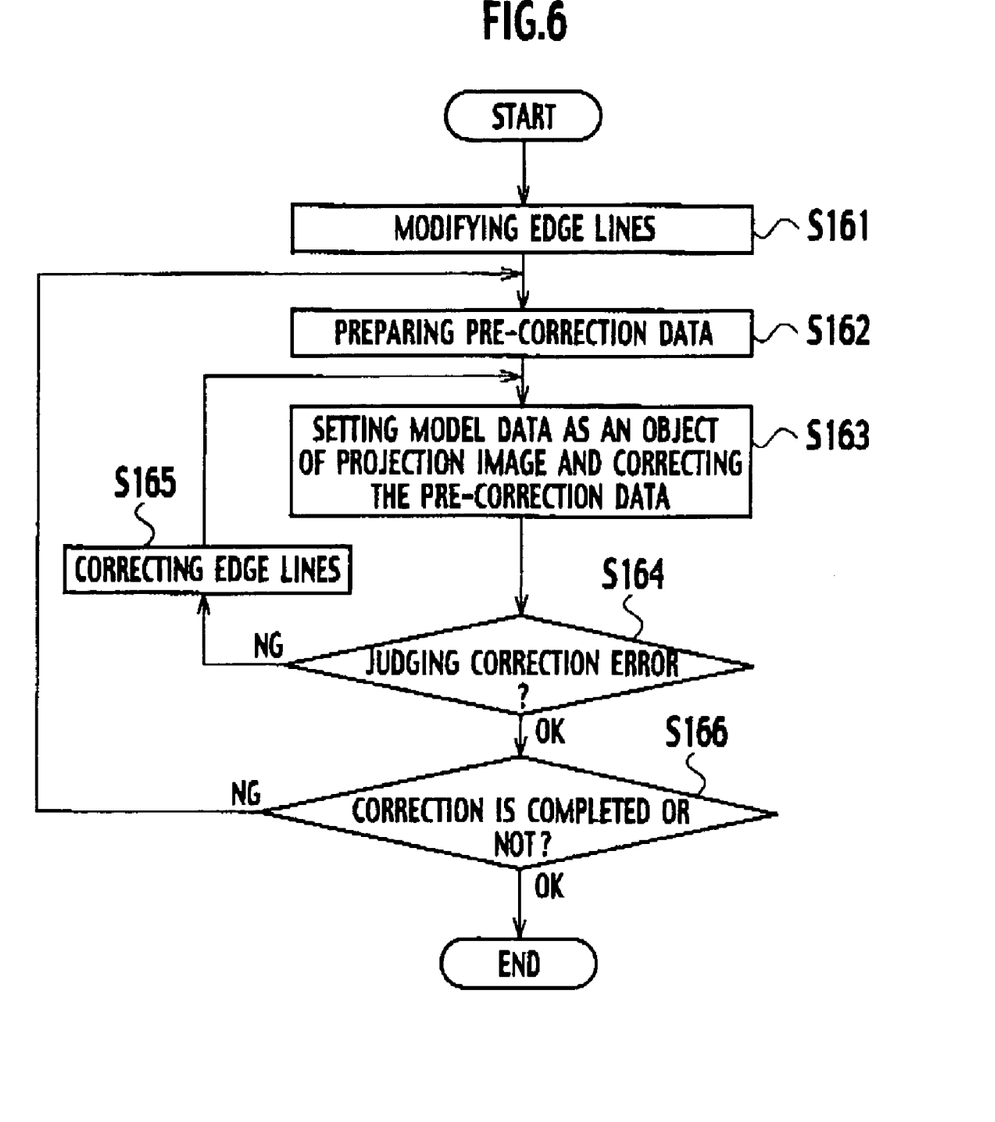
FIG. 6 is a flowchart depicting a method for optical proximity correction in accordance with the second embodiment of the present invention.

With reference now to FIG. 6, the computer implemented method for OPC in accordance with the second embodiment is described. The procedure shown in FIG. 6 corresponds to the step S13 and step S14 shown in FIG. 2.

(a) Step S161 corresponds to the procedure shown in FIG. 3. In the step S161, the edge line modifier 200 modifies the minute edge lines so as to prevent the excess OPC. Specifically, the protuberance modifier 17 shown in FIG. 5 deletes the protuberance 91 in the pattern 90a shown in FIG. 7A and generates the modified pattern 90b. The pre-correction data containing the modified pattern are stored in the pre-correction data storage unit 102.

Figure 7A:
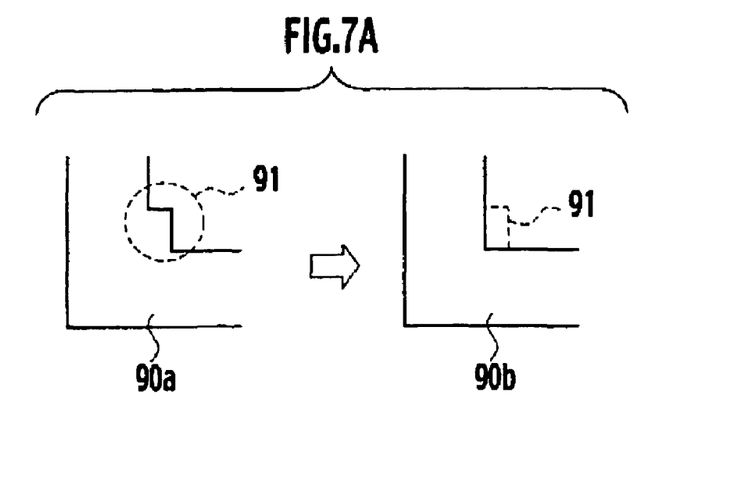
FIG. 7A, FIG. 7B, and FIG. 7C are example illustrations of circuit patterns in accordance with the second embodiment of the present invention.
Figure 7B:
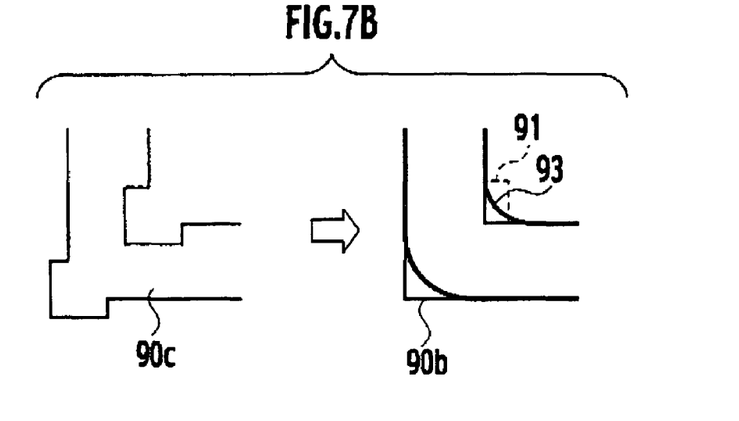
Figure 7C:
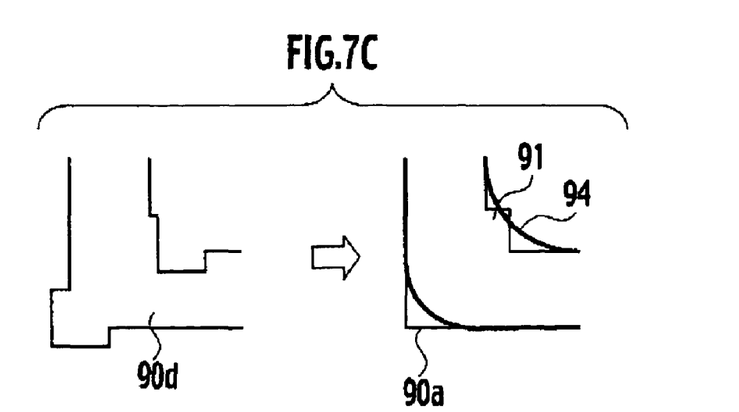

(b) In step S162, the OPC module 15 shown in FIG. 5 reads the pre-correction data containing the modified pattern 90b shown in FIG. 7A from the pre-correction data storage unit 102. Subsequently, in step S163, he OPC module 15 accesses the reference data in the reference data storage unit 104 and the model data containing the pattern 90a in the model data storage unit 105 Thereafter, the OPC module 15 applies the OPC to the modified pattern 90b contained in the pre-correction data. During the OPC, the OPC module 15 refers the pattern 90a and the reference data. The simulation module 24 executes a lithography simulation and estimates the projection image based on the corrected data.

(c) In step S164, the error detector 26 judges or determines whether the calculated projection image fulfills the requirement of the electrical circuit. If the calculated projection image does not fulfill the requirement, the error detector 26 judges the applied OPC is wrong. In this case, the procedure goes to step S165. Thereafter, the edge line 15 corrected and the steps S163–S164 are repeated. On the other hand, if the error detector 26 judges all corrected data fulfill the requirement as shown in FIG. 7C, the data interface 16 stores the corrected data in the corrected data storage unit 102.

As described above, the apparatus and the method for OPC shown in FIGS. 5, 6 make it possible to set the source data as the model data of the projection image during the OPC. Therefore, even though the minute edge lines are modified as shown in FIG. 7A so as to prevent the excess OPC, the generated projection pattern covers the shape formed by the minute edge lines as shown in FIG. 7C. Therefore, the apparatus and the method for OPC according to the second embodiment make it possible to prevent the excess OPC and reproduce the projection image that covers shape formed by the minute edge lines contained in the source data. Consequently, the apparatus and the method for OPC make it possible to avoid the violation of the design rule caused by the OPC and provide accurate projection image on the wafer.

THIRD EMBODIMENT

Figure 8:
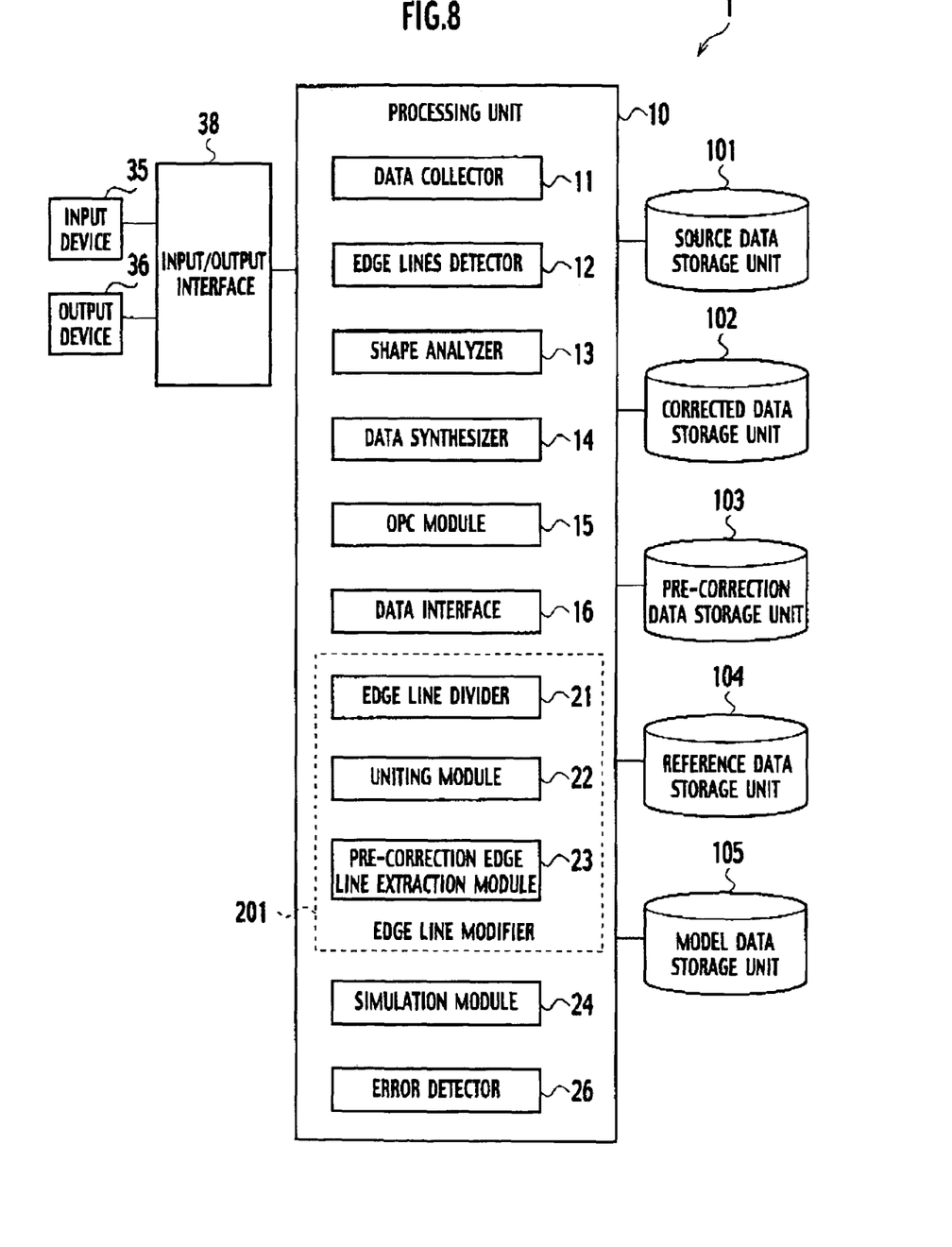
FIG. 8 is a block diagram of an apparatus for optical proximity correction in accordance with a third embodiment of the present invention.

With reference now to FIG. 8, the processing unit 10 of the apparatus for OPC 1 according to a third embodiment has the edge line modifier 201 containing an edge line divider 21, a uniting module 22, and a pre-correction edge line extraction module 23. Other components of the apparatus for OPC 1 shown in FIG. 8 are similar to the apparatus shown in FIG. 5. Therefore, detailed explanations for other components are eliminated.

The edge line divider 21 shown in FIG. 8 divides a portion that is adjacent to the minute edge line from the pattern contained in the OPC objectives. Specifically, the edge line divider 21 divides edge lines 173, 174 shown in FIG. 11B from the pattern 80a. The edge lines 173, 174 are adjacent to the minute edge lines 171, 172. The uniting module 22 shown in FIG. 8 unites three or more sequence minute edge lines and defines the united minute edge lines as a pre-correction edge line. The uniting module 22 also unites the single minute edge line and the divided portion and defines the united edge lines as the pre-correction edge line. Specifically, the uniting module 22 unites the edge line 61, 62, and 63 shown in FIG. 10A and defines the pre-correction edge lines 67 as shown in FIG. 10D. Further, the uniting module 22 unites the edge line 173 and the minute edge line 171 shown in FIG. 11B and defines the pre-correction edge lines 81. Similarly, the uniting module 22 unites the edge line 174 and the minute edge line 172 and defines the pre-correction edge lines 82. The pre-correction edge line extraction module 23 extracts the patterns containing the pre-correction edge line from the OPC objective data.

Figure 10A:
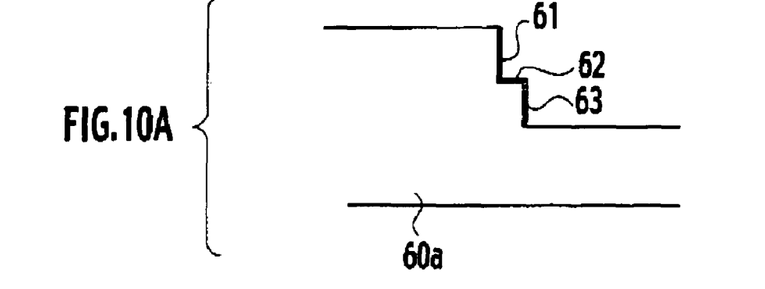
FIG. 10A, FIG. 10B, FIG. 10C, and FIG. 10D are example illustrations of circuit patterns in accordance with the second embodiment of the present invention.
Figure 10B:
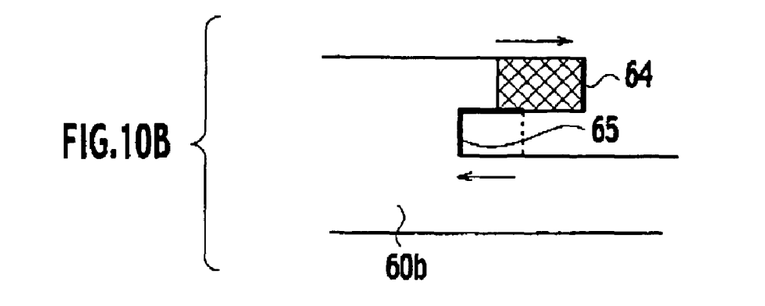

With reference to FIG. 10A, when the OPC is applied to the pattern 60a containing the shape formed by the minute edge lines 61, 62, and 63, the corrected pattern 60b shown in FIG. 10B may have the protuberance 64 and the hollow 65 as a result of excess OPC to the minute edge lines 61, 63 shown in FIG. 10A. In this case, the protuberance 54 and the hollow 65 generated by the excess OPC may have a bad influence on mask inspection and generate the wrong projection image on the wafer. Consequently, deleting the protuberance 64 and filling up the hollow 65 may be required.

Figure 11A:
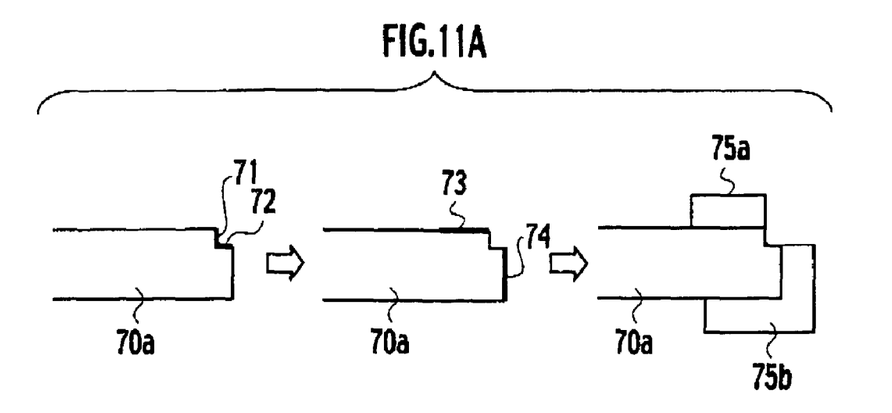
FIG. 11A, and FIG. 11B are another example illustrations of circuit patterns in accordance with the second embodiment of the present invention.

With reference next to FIG. 11A, when the OPC is applied to the pattern 70a containing the edge lines 71, 72 connecting to the edge lines 73, 74 at an angle, serifs 75a, 75b may be added to the pattern 70a since the OPC module 15 fails to detect the minute edge lines 73, 74.

Figure 9:
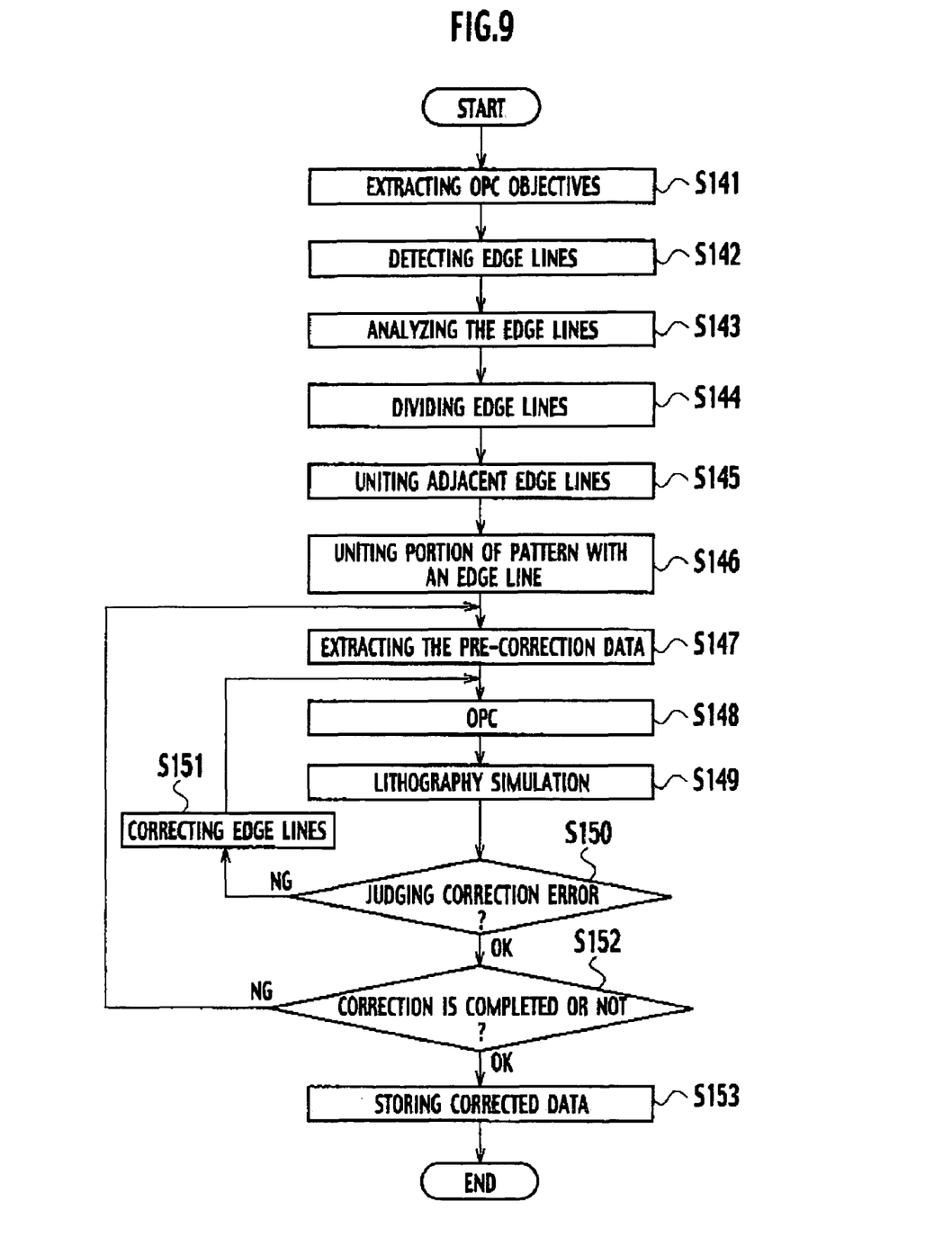
FIG. 9 is a flowchart depicting a method for optical proximity correction in accordance with a third embodiment of the present invention.

To prevent such excess OPC or fault OPC, the computer implemented method for OPC in accordance with the third embodiment is adopted. With reference next to FIG. 9, the computer implemented method for OPC in accordance with the third embodiment is described. The procedure shown in FIG. 9 corresponds to the step S13 and step S14 shown in FIG. 2

(a) In step S141, the data collector 11 shown in FIG. 8 extracts the OPC objectives from the source data stored in the source data storage unit 101. In step S142, the edge line detector 12 detects the minute edge lines. Specifically, the edge line detector 12 detects the minute edge lines 61, 62, 63 shown in FIG. 10A and the minute edge lines 171, 172 shown in FIG. 11B.

(b) Instep S143, the shape analyzer 13 shown in FIG. 8 analyzes the number of the adjacent minute edge lines and judges or determines whether the number is above three or not. Specifically, the shape analyzer 13 analyzes the number of the adjacent minute edge lines 61, 62, 63 shown in FIG. 10A and judges the number is above three. When the shape analyzer 13 analyzes the number of the adjacent minute edge lines 171, 172 shown in FIG. 11B, the shape analyzer 13 judges the number is not above three and determines two minute edge lines 171, 172 connects to the edge lines of the pattern 80a at an angle.

(c) In step S144, the edge line divider 21 shown in FIG. 8 divides the edge line adjacent to the two minute edge line from the OPC objectives. Specifically, the edge line divider 21 divides the edge lines 173, 174 from the pattern 80a as shown in FIG. 11B. In step S145, the uniting module 22 shown in FIG. 8 unites three or more adjacent minute edge lines such as the minute edge lines 61, 62, 63 shown in FIG. 10A and defines the united minute edge lines as a single pre-correction edge line 67 as shown in FIG. 10C.

(d) In step S146, the uniting module 22 unites each of two adjacent minute edge lines such as the minute edge lines 171, 172 and each of the divided edge lines 173, 174 shown in FIG. 11B and defines the united edge lines as pre-correction edge lines 81, 82.

Figure 10C:
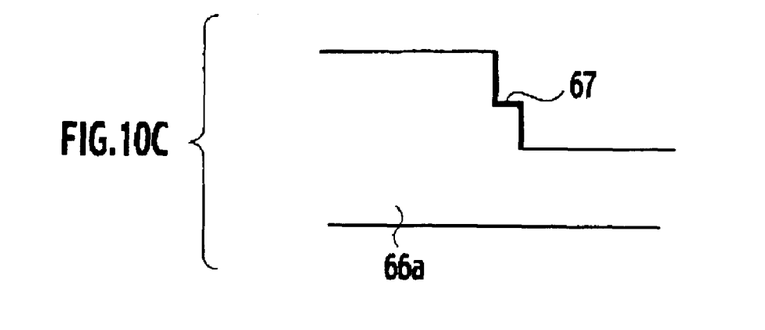
Figure 10D:
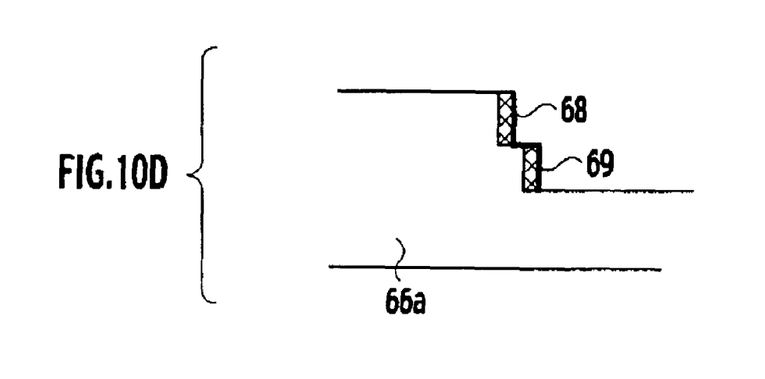
Figure 11B:
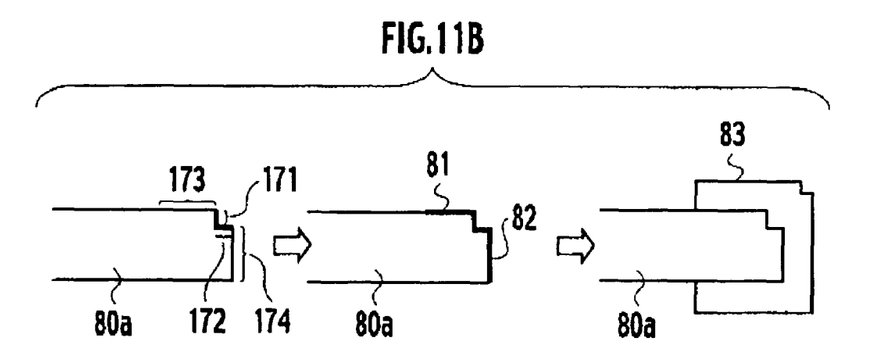

(e) In step S147, the pre-correction edge line extracting module 23 shown in FIG. 8 extracts the pre-correction edge lines 67, 81, and 82 shown in FIG. 10C and FIG. 11B. Thereafter, the OPC module 15 applies the OPC to the pre-correction edge lines and generates the corrected data in step S148. As the result of the OPC, the additional portions 68, 69 are added to the pattern 66a shown in FIG. 10D and the serif 83 is added to the pattern 80a shown in FIG. 11B.

(f) In step S149, the simulation module 24 shown in FIG. 8 calculates the projection image of the corrected data generated by the OPC module 15. In step S150, the error detector 26 judges or determines whether the calculated projection image on the wafer fulfills required conditions of the electrical circuit. If the error detector 26 judges the calculated projection image does not fulfill the required condition, the pre-correction edge lines is redefined in step S151 and the procedure from step S148 through step S150 is repeated.

(g) If the error detector 26 judges the calculated projection image fulfills the required condition in step S150, the error detector 26 judges or determines whether the OPC is applied to all pre-correction edge lines or not. If the pre-correction edge line remains, procedure form step S147 through step S152 is repeated.

(h) If the error detector 26 judges the OPC is applied to the all pre-correction edge lines and the calculated projection images of the corrected data fulfill the required condition in step S152, the data interface 16 stores the corrected data in the corrected data storage unit 102 as the corrected data.

Thus, the apparatus and the method for OPC according to the third embodiment prevent the excess OPC by uniting the three or more minute edge lines or uniting each of two sequence minute edge lines and the portion of the patterns. Such excess OPC is occurred locally around the minute edge lines and may generate the undesirable protuberance 64 and hollow 65 as shown in FIG. 10B and also may add wrong serifs 75a, 75b as shown in FIG. 11A. The undesirable protuberances, hollows, and serifs in the pattern decrease the precision of the projected image on the wafer and affect on the mask fabrication and inspection. However, the apparatus and method according to the third embodiment prevent to generate such undesirable protuberances, hollows, and serifs and make it possible to synthesis the accurate corrected data.

OTHER EMBODIMENTS

Although the invention has been described above by reference to the embodiment of the present invention, the present invention is not limited to the embodiment described above. Modifications and variations of the embodiment described above will occur to those skilled in the art, in the light of the above teachings.

For example, the apparatus according to the first embodiment shown in FIG. 1 adopts the protuberance modifier 17, the steps modifier 18, and the hollow modifier 19 On the other hand, the apparatus according to the third embodiment shown in FIG. 8 adopts the uniting module 22. However, adopting all modifiers and the uniting module 22 in the processing unit 10 is also available.

Further, the method for OPC according to the embodiments of the present invention is capable of being expressed as descriptions of a series of processing or commands for a computer system. Therefore, the methods for OPC shown in FIGS. 2, 3, 6, and 9 are capable of being formed as a computer program product to execute multiple functions of the CPU in the computer system. "The computer program product" includes, for example, various writable mediums and storage devices incorporated or connected to the computer system. The writable mediums include a memory device, a magnetic disc, an optical disc and any devices that record computer programs.

As described above, the present invention includes many variations of embodiments. Therefore, the scope of the invention is defined with reference to the following claims.

What is claimed is:

1. An apparatus for optical proximity correction comprising:
   a data collector configured to collect source data of an electrical circuit pattern;
   an edge line detector configured to detect a plurality of edge lines each of which has a size that is less than a line width of the electrical circuit pattern from the source data;
   an edge line modifier configured to modify each of the edge lines so as to prevent an excess optical proximity correction from providing incorrect data; and
   a data synthesizer configured to generate pre-correction data from the modified edge lines and the source data, the pre-correction data to be corrected by an optical proximity correction.

2. The apparatus of claim 1, further comprising a model data storage unit configured to store the source data as model data.

3. The apparatus of claim 2, further comprising an optical proximity correction module configured to set the model data as a target projection image and correct the pre-correction data and generate a corrected data.

4. An apparatus for optical proximity correction comprising:
   a data collector configured to collect source data of an electrical circuit pattern;
   an edge line detector configured to detect a plurality of edge lines each of which has a size that is less than a line width of the electrical circuit pattern;
   a shape analyzer configured to classify a shape formed by adjacent edge lines;
   an edge line modifier configured to modify each of the edge lines so as to prevent an excess optical proximity correction; and
   a data synthesizer configured to generate pre-correction data from the modified edge lines and the source data.

5. The apparatus of claim 4, wherein the edge line modifier further comprises a hollow modifier configured to flatten a hollow formed by the adjacent edge lines.

6. The apparatus of claim 4, wherein the edge line modifier further comprises a protuberance modifier configured to flatten a protuberance formed by the adjacent edge lines.

7. The apparatus of claim 4, wherein the edge line modifier further comprises a steps modifier configured to flatten steps formed by the adjacent edge lines.

8. An apparatus for optical proximity correction comprising:
   a data collector configured to collect source data of an electrical circuit pattern;
   an edge line detector configured to detect a plurality of edge lines each of which has a size that is less than a line width of the electrical circuit pattern;
   an edge line modifier configured to modify each of the edge lines so as to prevent an excess optical proximity correction; and
   a data synthesizer configured to generate pre-correction data from the modified edge lines and the source data,
   wherein the edge line modifier further comprises a uniting module configured to unite each of the edge lines and a portion of the electrical circuit pattern.

9. An apparatus for optical proximity correction comprising:
   a data collector configured to collect source data of an electrical circuit pattern;
   an edge line detector configured to detect a plurality of edge lines each of which has a size that is less than a line width of the electrical circuit pattern;
   an edge line modifier configured to modify each of the edge lines so as to prevent an excess optical proximity correction:
   a data synthesizer configured to generate pre-correction data from the modified edge lines and the source data:
   a model data storage unit configured to store the source data as model data;
   an optical proximity correction module configured to set the model data as a target projection image and correct the pre-correction data and generate a corrected data; and
   an error detector configured to judge whether a simulated projection image calculated from the corrected data fulfills required conditions of the electrical circuit.

10. A computer implemented method for optical proximity correction comprising:
    collecting source data of an electrical circuit pattern;
    detecting a plurality of edge lines each of which has a size that is less than a line width of the electrical circuit pattern from the source data;
    modifying each of the edge lines so as to prevent an excess optical proximity correction from providing incorrect data; and
    generating pre-correction data from the modified edge lines and the source data, the pre-correction data to be corrected by an optical proximity correction.

11. The method of claim 10, further comprising setting the model data as a target projection image and correcting the pre-correction data and generating a corrected data.

12. A computer implemented method for optical proximity correction comprising:
    collecting source data of an electrical circuit pattern;
    detecting a plurality of edge lines each of which has a size that is less than a line width of the electrical circuit pattern;

classifying a shape formed by the adjacent edge lines;
modifying each of the edge lines so as to prevent an excess optical proximity correction; and
generating pre-correction data from the modified edge lines and the source data.

13. The method of claim 12, wherein the modifying of each of the edge lines further comprises flattening a hollow formed by the edge lines.

14. The method of claim 12, wherein the modifying of each of the edge lines further comprises flattening a protuberance formed by the edge lines.

15. The method of claim 12, wherein the modifying of each of the edge lines further comprises flattening steps formed by the edge lines.

16. A computer implemented method for optical proximity correction comprising:
    collecting source data of an electrical circuit pattern;
    detecting a plurality of edge lines each of which has a size that is less than a line width of the electrical circuit pattern;
    modifying each of the edge lines so as to prevent an excess optical proximity correction; and
    generating pre-correction data from the modified edge lines and the source data,
    wherein the modifying of each of the edge lines further comprises uniting each of the edge lines and a portion of the electrical circuit pattern.

17. A computer implemented method for optical proximity correction comprising:
    collecting source data of an electrical circuit pattern;
    detecting a plurality of edge lines each of which has a size that is less than a line width of the electrical circuit pattern;
    modifying each of the edge lines so as to prevent an excess optical proximity correction
    generating pre-correction data from the modified edge lines and the source data;
    setting the model data as a target projection image and correcting the pre-correction data and generating a corrected data; and
    determining whether a simulated projection image calculated from the corrected data fulfills required conditions of the electrical circuit.

18. A computer-readable medium including a computer program for controlling a computer system to execute instructions so as to correct an optical proximity effect, the computer program comprising:
    instructions configured to collect a source data of an electrical circuit pattern stored in the computer system;
    instructions configured to detect a plurality of edge lines each of which has a size that is less than a line width of the electrical circuit pattern from the source data;
    instructions configured to modify each of the edge lines so as to prevent an excess optical proximity correction from providing incorrect data; and
    instructions configured to generate pre-correction data from the modified edge lines and the source data, the pre-correction data to be corrected by an optical proximity correction.

* * * * *